United States Patent
Münzer

(10) Patent No.: US 11,688,998 B2
(45) Date of Patent: Jun. 27, 2023

(54) SEMICONDUCTOR DEVICES AND METHODS FOR TIME-OF-FLIGHT AND PROXIMITY MEASUREMENTS

(71) Applicant: ams AG, Premstaetten (AT)

(72) Inventor: Martin Münzer, Premstaetten (AT)

(73) Assignee: AMS AG, Premstätten (AT)

( * ) Notice: Subject to any disclaimer, the term of this patent is extended or adjusted under 35 U.S.C. 154(b) by 346 days.

(21) Appl. No.: 16/767,888

(22) PCT Filed: Dec. 3, 2018

(86) PCT No.: PCT/EP2018/083349
§ 371 (c)(1),
(2) Date: May 28, 2020

(87) PCT Pub. No.: WO2019/110507
PCT Pub. Date: Jun. 13, 2019

(65) Prior Publication Data
US 2021/0003704 A1  Jan. 7, 2021

(30) Foreign Application Priority Data
Dec. 4, 2017 (EP) .................................... 17205180

(51) Int. Cl.
*H01S 5/42* (2006.01)
*G01J 1/42* (2006.01)
(Continued)

(52) U.S. Cl.
CPC ............ *H01S 5/423* (2013.01); *G01J 1/4204* (2013.01); *G01S 7/484* (2013.01); *G01S 7/4813* (2013.01);
(Continued)

(58) Field of Classification Search
CPC .......... H01S 5/423; H01S 5/005; H01S 5/042; G01J 1/4204; G01S 7/4813; G01S 7/4814;
(Continued)

(56) References Cited

U.S. PATENT DOCUMENTS

| | | | |
|---|---|---|---|
| 2013/0207970 A1 | 8/2013 | Shpunt et al. | |
| 2014/0268105 A1* | 9/2014 | Bills | G02B 21/0052 356/450 |
| 2015/0260830 A1* | 9/2015 | Ghosh | G01S 7/484 250/208.1 |

FOREIGN PATENT DOCUMENTS

| | | |
|---|---|---|
| CN | 101897089 A | 11/2010 |
| CN | 105143820 A | 12/2015 |

(Continued)

OTHER PUBLICATIONS

Daiji et al. "Demonstration of Blue and Green GaN-Based Vertical-Cavity Surafce-Emitting Lasers by Current Injection at Room Temperature", Applied Physics Express 4 (2011), p. 072103-1-072103-3. (Year: 2011).*

(Continued)

*Primary Examiner* — David P Porta
*Assistant Examiner* — Mamadou Faye
(74) *Attorney, Agent, or Firm* — MH2 Technology Law Group LLP

(57) ABSTRACT

An emitter of electromagnetic radiation is configured for modes of operation providing fields of illumination of different widths, and a photodetector is configured for time-of-flight and proximity measurements by detecting electromagnetic radiation that is emitted by the emitter and reflected to the photodetector. The emitter is operated by a driver, which is configured for an alternation between the modes of operation. A time-of-flight measurement is performed when the field of illumination is narrow, and a (Continued)

proximity or ambient light measurement is performed when the field of illumination is wide.

8 Claims, 2 Drawing Sheets

(51) Int. Cl.
*G01S 7/481* (2006.01)
*G01S 7/484* (2006.01)
*G01S 7/4865* (2020.01)
*G01S 17/10* (2020.01)
*H01S 5/042* (2006.01)
*H01S 5/00* (2006.01)

(52) U.S. Cl.
CPC .......... *G01S 7/4814* (2013.01); *G01S 7/4816* (2013.01); *G01S 7/4865* (2013.01); *G01S 17/10* (2013.01); *H01S 5/005* (2013.01); *H01S 5/042* (2013.01)

(58) Field of Classification Search
CPC ........ G01S 7/484; G01S 7/4865; G01S 17/10; G01S 17/894; G01S 17/04
See application file for complete search history.

(56) References Cited

FOREIGN PATENT DOCUMENTS

| | | |
|---|---|---|
| CN | 107005023 A | 8/2017 |
| EP | 2 827 175 A2 | 1/2015 |
| WO | 2016/162236 A1 | 10/2016 |

OTHER PUBLICATIONS

Masanori et al. "High Power Non-mechanical Beam Scanner based on VCSEL Amplifier", IEEE Oct. 2016, p. 1-3 (Year: 2016).*
Date for Masanori et al. (Year: 2016).*
European Patent Office, International Search Report for PCT/EP2018/083349 dated Feb. 18, 2019.
Chinese Office Action issued in Chinese Application No. 201880073553.6, dated Mar. 1, 2023, with English language translation, 12 pages.

* cited by examiner

SEMICONDUCTOR DEVICES AND METHODS FOR TIME-OF-FLIGHT AND PROXIMITY MEASUREMENTS

The present disclosure applies to the field of time-of-flight measurement in combination with proximity or ambient light measurements.

BACKGROUND OF THE INVENTION

The distance of an object can be measured by the time-of-flight (TOF) method, which determines the time elapsed between the emission of a light signal and the reception of the same light signal after its reflection at the object. A vertical-cavity surface-emitting laser (VCSEL) can be used as emitter, and the arrival of the reflected signal can be detected by a photodetector.

The field of illumination that is required for proximity measurements is wider than the field of illumination that is required for long-distance time-of-flight measurements. A light-emitting diode (LED) has a relatively wide field of illumination and is appropriate for proximity measurements, whereas a vertical-cavity surface-emitting laser has a comparatively narrow field of illumination in its lasing mode and is appropriate for a time-of-flight measurement. Therefore an arrangement of different sources of electromagnetic radiation, in particular a light-emitting diode and a vertical-cavity surface-emitting laser, which are integrated in two discrete semiconductor dies, may be required within the same package if time-of-flight and proximity measurements are both desired.

SUMMARY OF THE INVENTION

The definitions as described above also apply to the following description unless stated otherwise.

The semiconductor device comprises an emitter of electromagnetic radiation, the emitter being configured for modes of operation providing fields of illumination of different widths, and a photodetector configured for time-of-flight and proximity measurements by detecting electromagnetic radiation that is emitted by the emitter and reflected to the photodetector. The emitter is operated by a driver, which is configured for an alternation between the modes of operation.

In an embodiment of the semiconductor device, the emitter is a vertical-cavity surface-emitting laser (VCSEL). The driver may especially be configured to generate driving currents for the vertical-cavity surface-emitting laser, one of the driving currents being below a lasing threshold, and one of the driving currents being above the lasing threshold.

In a further embodiment, the photodetector is part of a photodetector device comprising a semiconductor die, and the emitter is part of an emitter device comprising a further semiconductor die. The driver may especially be integrated in the emitter device. Alternatively, the driver may be integrated in the photodetector device.

In a further embodiment, an integrated circuit of the photodetector device is configured for performing and evaluating time-of-flight measurements and proximity or ambient light measurements using the emitter and the photodetector.

In a further embodiment, a carrier is provided to carry the photodetector device and the emitter device, and a cover with windows is mounted on the carrier to cover the photodetector device and the emitter device, the windows being arranged above the photodetector and the emitter.

In a further embodiment, the driver is configured to switch the modes of operation when values of varying distances that are detected by a time-of-flight or proximity measurement pass a predescribed limit value.

The method for time-of-flight and proximity measurements comprises operating an emitter of electromagnetic radiation alternatively in different modes of operation providing fields of illumination of different widths, and performing a time-of-flight measurement when the field of illumination is narrow, and a proximity or ambient light measurement when the field of illumination is wide.

A vertical-cavity surface-emitting laser can be used as emitter, and a driver can be employed to generate driving currents, one of the driving currents being below the lasing threshold of the vertical-cavity surface-emitting laser and one of the driving currents being above the lasing threshold.

In applications of the method using a vertical-cavity surface-emitting laser and a driver, the proximity or ambient light measurement is performed when the driving currents is below the lasing threshold, and the time-of-flight measurement is performed when the driving currents is above the lasing threshold of the vertical-cavity surface-emitting laser.

In variants of the method, the different modes of operation are switched when values of varying distances that are detected by a time-of-flight or proximity measurement pass a predescribed limit value.

The following is a detailed description of examples of the semiconductor device and the method for time-of-flight and proximity measurements in conjunction with the appended figures.

DETAILED DESCRIPTION

Figure 1:
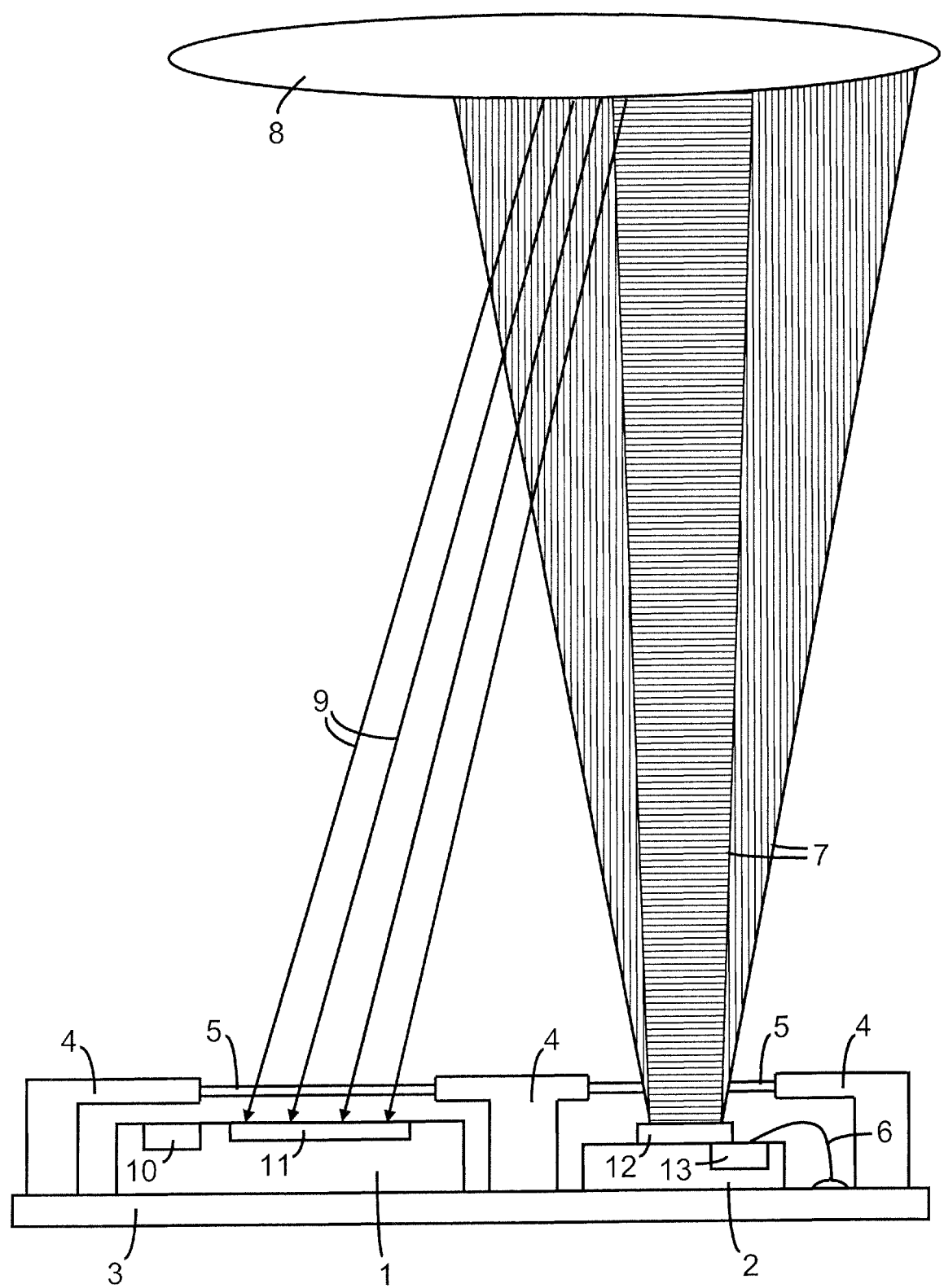
FIG. 1 shows a semiconductor device including emitter, driver and photodetector.

FIG. 1 is a cross section of a semiconductor device comprising a photodetector device 1 and an emitter device 2 in a common package. The emitter device 2 is a single die with an emitter 12, which is provided as a source of electromagnetic radiation for alternative performances of time-of-flight and proximity measurements. In particular, the emitter 12 may be a vertical-cavity surface-emitting laser (VCSEL).

A driver 13, which may especially be integrated in the emitter device 2, enables an alternative operation of the emitter 12 in different modes. Thus either a narrow field of illumination can be achieved, especially by generating a collimated laser beam, or a wider field of illumination, which resembles the field of illumination of a light-emitting diode (LED). A laser beam can be generated by operating a vertical-cavity surface-emitting laser above its lasing threshold. If the vertical-cavity surface-emitting laser is instead driven below its lasing threshold, the emitted light is not narrowly confined, but spread in a wide field of illumination.

For time-of-flight measurements, the vertical-cavity surface-emitting laser is operated above the lasing threshold with very short pulses, which may typically have a duration in the order of magnitude of one hundred picoseconds. For proximity or ambient light measurements, the vertical-cavity surface-emitting laser is operated below the lasing threshold with longer pulses, which may typically have a duration in the order of magnitude of microseconds (μs), to obtain a higher intensity of emission. The driver 13 may especially be configured for an application of long pulses of currents of less than 200 mA, typically 15-20 mA, and short pulses of currents of typically 200 mA or more.

The driver 13 may also be configured for an automatic switching between time-of-flight measurement and proximity measurement at a predefined limit value of the detected distances. The driver 13 can in particular be configured to switch from time-of-flight measurement to proximity measurement, when the values of the varying distances detected by the time-of-flight measurement decrease rapidly and/or below a predefined limit value. For applications in a mobile phone, a distance of typically 10 cm, for instance, may be an appropriate limit value.

The package of the device shown in FIG. 1 includes a carrier 3, on which the photodetector device 1 and the emitter device 2 are mounted, and a cover 4 with windows 5 above the photodetector 11 and the emitter 12. Electric connections 6 between contacts of the photodetector device 1, contacts of the emitter device 2, and further conductors provided in the package are schematically indicated by a bonding wire.

Contacts for external electric connections and/or conductor tracks may also be provided, particularly in the carrier 3 and on the rear side of the carrier 3, opposite the photodetector device 1 and the emitter device 2. Electric connections of semiconductor packages are known per se and can be provided according to the requirements of individual applications.

FIG. 1 shows examples of two different light beams, which can alternatively be generated and emitted by the emitter 12. The solid angle of emission 7 is smaller for a collimated beam, which is indicated in FIG. 1 by a horizontal hatching. Such a beam can be generated by a vertical-cavity surface-emitting laser driven in the lasing mode. The solid angle of emission 7 is essentially larger when such an emitter 12 is driven below its lasing threshold. An example of a wide beam is shown in FIG. 1 with a vertical hatching.

The beam may additionally be shaped by optical components, which may be arranged above the emitter 12, in particular in the window 5. A lens may be particularly favourable if long distances are to be measured by the time-of-flight method.

When the beam is reflected at an object 8, and reflected beams 9 enter the photodetector 11 through the window 5, a time-of-flight measurement or a proximity measurement can be performed, in accordance with the width of the field of illumination that is provided by the operation of the emitter 12 by the driver 13.

An optical component may be arranged above the photodetector 11, in particular in the window 5, according to the requirements of individual applications. A filter may be desired to shield ambient light that is not emitted by the emitter 12 and reflected by the object 8.

The photodetector device 1 may be provided with an integrated circuit 10 for the operation of the photodetector 11 and the evaluation of a measurement. The integrated circuit 10 may also be configured to address the driver 13 according to the measured value of the distance of the reflecting object 8, in order to trigger the switching between the modes of operation of the emitter 12.

Figure 2:
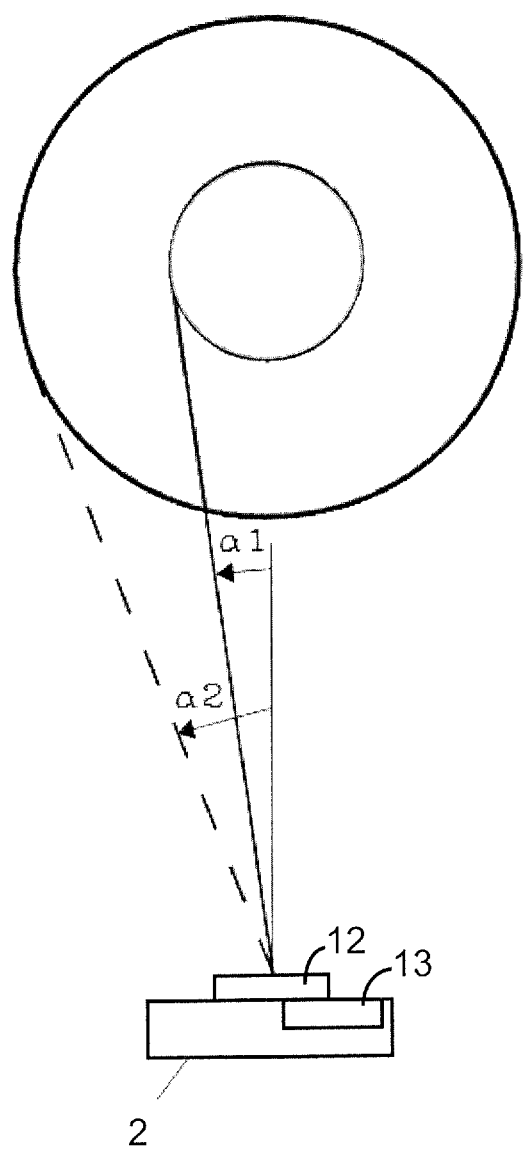
FIG. 2 depicts the dependence of the field of illumination of the emitter on the mode of operation.

FIG. 2 depicts the dependence of the field of illumination of the emitter 12 on the mode of operation by the driver 13. A smaller angle of half aperture $\alpha 1$ is obtained when the driving current is high, and a larger angle of half aperture $\alpha 2$ is obtained when the driving current is low. The corresponding concentric circles illustrate the different cross sections of the beam across its optical axis.

The described application of a single light source for different fields of illumination enables a substantial reduction of the complexity and size of a device that is suitable for both time-of-flight measurements and proximity or ambient light measurements.

The invention claimed is:

1. A semiconductor device, comprising:
    an emitter of electromagnetic radiation, wherein the emitter is configured for modes of operation providing fields of illumination of different widths; and
    a photodetector configured for time-of-flight and proximity measurements by detecting the electromagnetic radiation that is emitted by the emitter and reflected to the photodetector;
    wherein the emitter is operated by a driver, which is configured for alternation between the modes of operation,
    wherein the emitter is a vertical-cavity surface-emitting laser,
    wherein the driver is configured to generate driving currents,
    wherein a first driving current of the driving currents is below a lasing threshold of the emitter,
    wherein a second driving current of the driving currents is above the lasing threshold of the emitter,
    wherein the first driving current is provided for a proximity or ambient light measurement, and
    wherein the second driving current is provided for a time-of-flight measurement.

2. The semiconductor device of claim 1, further comprising: the photodetector device comprising a semiconductor die; and the emitter comprising: a further semiconductor die.

3. The semiconductor device of claim 2, further comprising: an integrated circuit of the photodetector; wherein the integrated circuit is configured for performing and evaluating the time-of-flight measurements, the proximity measurements, or ambient light measurements using the emitter and the photodetector.

4. The semiconductor device of claim 2, wherein the driver is integrated in the emitter.

5. The semiconductor device of claim 2, further comprising: a carrier carrying the photodetector and the emitter; and a cover with windows, wherein the windows are arranged above the photodetector and the emitter.

6. The semiconductor device of claim 1, wherein the driver is configured to switch the modes of operation when values of varying distances that are detected by the time-of-flight measurement or the proximity measurement pass a predescribed limit value.

7. A method for time-of-flight and proximity measurements, the method comprising:
    operating an emitter of electromagnetic radiation alternatively in different modes of operation providing fields of illumination of different widths;
    performing a time-of-flight measurement when a field of illumination of the fields of illumination is narrow, and a proximity or ambient light measurement when the field of illumination of the fields of illumination is wide;
    using a vertical-cavity surface-emitting laser as the emitter; and
    using a driver to generate driving currents for the emitter;
    wherein the proximity or ambient light measurement is performed when a first driving current of the driving currents is below a lasing threshold of the emitter, and wherein the time-of-flight measurement is performed when a second driving current of the driving currents is above the lasing threshold of the emitter.

8. The method of claim 7, wherein the different modes of operation are switched when values of varying distances that are detected by the time-of-flight measurement or the proximity measurement pass a predescribed limit value.

* * * * *